United States Patent

Inoue et al.

[11] Patent Number: 5,984,165
[45] Date of Patent: Nov. 16, 1999

[54] METHOD OF BONDING A CHIP PART TO A SUBSTRATE USING SOLDER BUMPS

[75] Inventors: Katsuhiro Inoue; Nobuo Igusa; Takeshi Ohori, all of Kawasaki, Japan

[73] Assignee: Fujitsu Limited, Kawasaki, Japan

[21] Appl. No.: 08/873,742

[22] Filed: Jun. 12, 1997

[30] Foreign Application Priority Data

Nov. 29, 1996 [JP] Japan ..................................... 8-320583

[51] Int. Cl.[6] .............................. B23K 31/02; H05B 1/00; A61M 16/00
[52] U.S. Cl. ................................. 228/180.22; 228/234.1; 219/209; 392/418
[58] Field of Search ............................. 228/180.22, 44.7, 228/234.1; 392/418; 219/209

[56] References Cited

U.S. PATENT DOCUMENTS

| | | | |
|---|---|---|---|
| 3,804,691 | 4/1974 | Trivedi | 156/272 |
| 3,926,360 | 12/1975 | Moister, Jr. | 228/180 |
| 3,964,666 | 6/1976 | Dinella et al. | 228/106 |
| 4,607,779 | 8/1986 | Burns | 228/106 |
| 4,771,929 | 9/1988 | Bahr et al. | 228/102 |
| 4,792,302 | 12/1988 | Baker et al. | 432/59 |
| 4,856,702 | 8/1989 | Kloucek | 228/123 |
| 4,938,409 | 7/1990 | Roberts | 228/178 |
| 5,148,003 | 9/1992 | Haj-Ali-Ahmadi et al. | 219/388 |
| 5,305,944 | 4/1994 | Yoshida et al. | |
| 5,433,368 | 7/1995 | Spigarelli | 228/8 |
| 5,532,457 | 7/1996 | Cobb et al. | |
| 5,607,609 | 3/1997 | Sakuyama et al. | 219/388 |
| 5,626,280 | 5/1997 | Ciambrone | 228/180.21 |
| 5,632,434 | 5/1997 | Evans et al. | 228/44.7 |
| 5,648,005 | 7/1997 | Cobb et al. | 219/411 |
| 5,770,835 | 6/1998 | Sakuyama et al. | 219/388 |
| 5,844,208 | 12/1998 | Tustaniwskyj et al. | 219/494 |

FOREIGN PATENT DOCUMENTS

| | | |
|---|---|---|
| 54-162465 | 12/1979 | Japan . |
| 56-083927 | 7/1981 | Japan . |
| 62-101040 | 5/1987 | Japan . |

*Primary Examiner*—Patrick Ryan
*Assistant Examiner*—Kiley Stoner
*Attorney, Agent, or Firm*—Staas & Halsey

[57] ABSTRACT

A method for bonding a chip part, having solder bumps on the underside thereof, to a base material. The method includes the steps of placing the chip part at a specific position on the base material, placing a weight on the chip part, the weight being based on the number of solder bumps mounted on the chip part and a surface tension of the solder bumps at melting, and irradiating, with an electromagnetic wave, an upper surface of the weight to transfer heat to the solder bumps through the weight and the chip, thereby melting the solder bumps and bonding the chip part to the base material.

18 Claims, 5 Drawing Sheets

METHOD OF BONDING A CHIP PART TO A SUBSTRATE USING SOLDER BUMPS

BACKGROUND OF THE INVENTION

1. Field of the Invention

The present invention relates to a method of bonding chip parts whereby a chip part having solder bumps on the underside is bonded to a base material and an apparatus of the same, particularly to the method of bonding chip parts suitable for use in replacing bare chips (flip chips) on an MCM (Multi Chip Module) board, etc. where bare chips are mounted, and an apparatus for the same.

2. Description of the Related Art

In recent years, the MCM (Multi Chip Module) has been used as a CPU in small-sized personal equipment and the like. On a board of the MCM, plural bare chips (chip parts) of LSIs and the like are mounted. On the underside of a bare chip, multiple solder bumps are provided in advance, at which input and output terminals of the bare chip are electrically connected to patterns on the board (base material), and at the same time, the bare chip is bonded onto the board. In manufacturing an MCM, plural bare chips are disposed at specific positions on a board. Heating, so as to melt the solder bumps, bonds the bare chips on the board at the same time.

After manufacturing the MCM, when the inspection result confirms a defective bare chip, only the defective bare chip is removed to be replaced with a new one. With such a replacement of a bare chip, in order to bond a new bare chip on a board, the impulse heating system and the hot air heating system have been applied as a technique to melt solder bumps on the underside of the bare chip.

Figure 7:
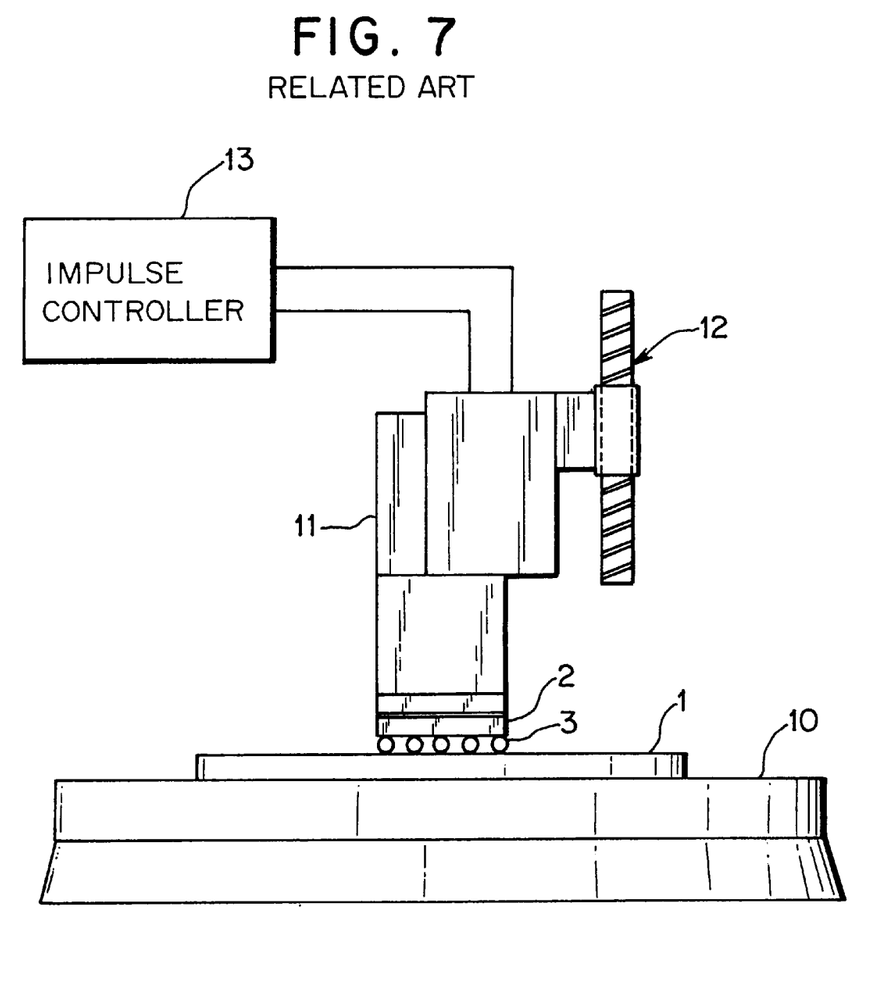
FIG. 7 is a side view showing a construction of a conventional apparatus for bonding chip parts.

FIG. 7 shows an example of an apparatus in which the impulse heating system is applied. This apparatus shown in FIG. 7 comprises a preheating plate 10, reflow tool 11, driving mechanism 12, and impulse controller 13.

The preheating plate 10, on which a work [board (base material) 1 and bare chip (silicon wafer) 2] to be replaced is mounted to be preheated, is incorporated with a heating coil (not illustrated) etc.

The reflow tool (heating tool) 11 comes into contact with the upper surface of a bare chip 2 and heats solder bumps 3 on the lower surface of the bare chip 2.

The driving mechanism 12 drives the reflow tool 11 vertically, which is built up with a mechanism such as a ball screw and a motor combined. This driving mechanism 12 is designed to be controlled through a feedback control loop by a controller (not illustrated) in accordance with a load detected by a load cell (not illustrated).

The impulse controller 13 applies a voltage to the reflow tool 11 to run a specific impulse current (for example, 60 A), and heats the reflow tool 11 through the resistance thereof. The impulse controller 13 maintains the reflow tool 11 at a constant stabilized temperature in accordance with a temperature of the reflow tool 11 detected by a thermocouple not illustrated.

In the foregoing apparatus in which the impulse heating system is applied, the board (base material) 1 is mounted on the preheating plate 10, and the bare chip 2 provided with multiple solder bumps 3 on the underside is mounted at a specific position on the board 1.

Thereafter, while the preheating plate 10 preheats the board 1, bare chip 2, and solder bumps 3, the driving mechanism 12 shifts down the reflow tool 11 to bring the reflow tool 11 into contact softly with the upper surface of the bare chip 2, then detects the height of the bare chip 2, and shifts up the reflow tool 11 to a height in which the thermal expansion of the board (for example, a base material of molybdenum) 1, the reflow tool 11, and the like is taken into consideration, thus positioning the reflow tool 11.

And the impulse heating controlled by the impulse controller 13 is applied to the reflow tool 11 to heat up to a specific temperature, and the solder bumps 3 on the underside of the bare chip 2 are melted by the heat. At that moment, since the board 1 and the reflow tool 11 expand by the heat of the reflow tool 11, the space between the board 1 and the reflow tool 11 shrinks; consequently, the bare chip 2 is pressed toward the board 1 through the melted solder bumps 3 to be bonded to the board 1.

On the other hand, in the apparatus not illustrated in which the hot air heating system is applied, while a bare chip is disposed at a specific position on a board, blown hot air melts the solder bumps, thus bonding the bare chip onto the board through the solder bumps.

However, in the aforementioned impulse heating system in FIG. 7, the reflow tool 11 directly comes into contact with the bare chip 2 to apply a pressure. Therefore, the following problems will occur unless the reflow tool 11 is positioned at an optimum height with the thermal expansion taken into consideration.

When the reflow tool 11 is positioned at a height much lower than the optimum, an excessive pressure is applied to the bare chip 2, so that the solder bumps 3 can be crushed to make a short-circuit or the bare chip 2 can be crushed. On the contrary, when the reflow tool 11 is positioned at a height much higher than the optimum, a sufficient pressure is not applied to the bare chip 2. Therefore, it is not possible to sink the bare chip 2 into the solder bumps 3, and not possible to reliably bond the bare chip 2 to the board 1. Thus, the accuracy of the reflow tool 11 and the like and the positioning accuracy influence the quality of the work (the board 1 of the MCM, etc. where the bare chip 2 is replaced).

On the other hand, in the hot air heating system, since hot air blows out so as to surround the work to be bonded, the other parts can be influenced by the heat. In addition, it is impossible to press a bare chip toward a board by applying an appropriate load, and adjusting a sinkage of the bare chip 2 is impossible.

SUMMARY OF THE INVENTION

The present invention has been made in view of the foregoing problems, and it is therefore an object of the invention to provide a method of bonding chip parts whereby bonding by fine solder bumps can be performed uniformly and reliably so that not only bonding quality but also product quality can be enhanced, and to provide an apparatus for the same.

In order to accomplish the foregoing object, the method of bonding chip parts according to the present invention is a method for bonding a chip part having solder bumps on the underside thereof to a base material by the solder bumps, and is characterized in that: the chip part is disposed at a specific position on the base material; a weight made of a heat sink material having a specific weight set based on the number of the solder bumps and a surface tension at melting of the solder bumps is mounted on the upper surface of the chip part; and thereafter, electromagnetic waves are irradiated to the upper surface of the weight to heat the weight and the heat is transferred through the weight to the solder bumps on the underside of the chip part to melt the solder bumps and bond the chip part to the base material.

The chip bonding apparatus according to the invention is an apparatus for bonding a chip part having solder bumps on the underside thereof to a base material by the solder bumps, and is characterized by comprising: a weight mounted on the chip part disposed at a specific position on the base material, made of a heat sink material having a specific weight set based on the number of the solder bumps and a surface tension at melting of the solder bumps; and an electromagnetic wave irradiating apparatus for irradiating electromagnetic waves to the upper surface of the weight to heat the weight, whereby the heat is transferred through the weight to the solder bumps on the underside of the chip part to melt the solder bumps and bond the chip part to the base material.

Further, infrared rays radiated from an infrared heater (electromagnetic wave irradiating apparatus) may be used for the electromagnetic waves. In this case, the weight may be formed of a carbon only, a carbon with a heat resistant glass coated on the outer surface, a combination of a carbon and copper, a copper only, or an aluminum only.

A plane shape of the upper surface of the weight may be identical or virtually identical to an irradiation shape made by infrared irradiation from the infrared heater. And, the plane shape of the lower surface of the weight may be identical or virtually identical to the plane shape of the upper surface of the chip part, and the weight may be formed so as to expand from the lower side toward the upper side. Further, irregularities may be formed on the upper surface of the weight.

On the other hand, a shield plate for shielding the infrared rays may cover the other parts except for the chip part on the base material. In this case, a mirror finish may be applied in advance on the outer surface of the shield plate. Or, the shield plate may be cooled by running a refrigerant in a refrigerant passage incorporated in or attached to the shield plate. Or, an inert gas may be used for the refrigerant, the inert gas may be blown from the refrigerant passage (through the blowout hole) to a bonding area between the chip part and the base material and to adjoining areas thereof to perform a purge by the inert gas.

Further, in irradiating the infrared rays from the infrared heater to the weight, the following controls may be done.

(1) A controller controls an infrared output power from the infrared heater such that a rise temperature higher than the melting temperature of the solder bumps is set as a target temperature, when the temperature reaches the melting temperature, the target temperature is switched to the melting temperature.

(2) In (1), before setting the rise temperature as the target temperature, a preheating temperature lower than the melting temperature of the solder bumps is set as a target temperature, and the solder bumps are heated in advance to the preheating temperature.

(3) A space between the infrared heater and the upper surface of the weight is adjusted by a driving mechanism for elevating the infrared heater, and thereby the heating temperature or the temperature distribution of the solder bumps is controlled.

(4) A temperature of the solder bumps is measured by a radiation thermometer, in accordance with the measured result, the controller controls the output of the infrared heater through a feedback control loop.

Thus, according to the method of bonding chip parts of the invention and the apparatus for the same, the following effects and advantages can be acquired.

(1) Since, the weight made of a heat sink material with an appropriate weight is mounted on the chip part, electromagnetic waves such as infrared rays are irradiated on the upper surface of the weight to heat and melt the solder bumps on the underside of the chip part in noncontact, the positioning of the reflow tool becomes unnecessary, the weight is free of the thermal expansion of the base material and the like, exerts an appropriate pressure to the chip part by its self-weight, and sinks the chip part into the melted solder bumps an appropriate amount. Accordingly, bonding by fine solder bumps can be done uniformly and reliably, the bonding quality is stabilized, and the production quality of a MCM and the like is significantly enhanced. Further, an equipment requiring a precise control is not needed, and an inexpensive equipment (apparatus) for bonding chip parts can be provided, which greatly contributes to enhancing productivity.

(2) Using a heat absorbing carbon as the material for the weight can efficiently heat the chip part to melt the solder bumps, even if the chip part is a non-absorbing material of the infrared rays.

(3) Applying a heat resistant glass coating on the outer surface of the weight made of a carbon can reliably prevent the carbon from deforming due to oxidation (change into a soot) of the carbon by the heat.

(4) Using a carbon and copper in combination to form the weight can sufficiently make the weight heavy without increasing the volume of the weight, which is effective especially in case the sinkage of the chip part must be increase at melting of the solder bumps.

(5) Gradual heating and gradual cooling are needed, depending on the property of the solder bumps and base material board. In such a case, using the weight made of a copper can prevent a sharp increase of temperature and a sharp cooling.

(6) Making the weight of an aluminum only will lighten the weight, and the heat becomes difficult to be transferred as the temperature goes up to some degree; and therefore, the weight made of an aluminum is effective when a stabilized heating with a low load and low temperature is required.

(7) Since the plane shape of the upper surface of the weight is designed to be identical or virtually identical to the shape of infrared irradiation from the infrared heater, the infrared rays can be received efficiently only on the upper surface of the weight without irradiating an area other than the weight.

(8) Since the plane shape of the lower surface of the weight is made to be identical or virtually identical to the plane shape of the upper surface of the chip part and the weight is formed in a upward divergent shape from the lower surface toward the upper surface, the weight can be mounted on the upper surface of the chip part without influencing the other parts except the chip part to be heated, and in addition, a sinkage load to be applied to the chip part can be adjusted by the area of the upper surface of the weight.

(9) Forming the irregularities on the upper surface of the weight can increase the surface area to efficiently heat the weight, and in addition, forming the irregularities so as to correspond to an incident angle of the infrared rays irradiated from the infrared heater makes it possible to receive the infrared rays more efficiently to heat the weight.

(10) Shielding parts other than the chip part by the shield plate in advance can reliably prevent the heat from influencing the parts except for the chip part to be heated.

(11) Since, a mirror finish is applied in advance on the outer surface of the shield plate, the infrared rays, diverted from the upper surface of the weight and irradiating the shield plate, reflects on the outer surface of the shield plate, the temperature rise inside the shield plate can be prevented, and in addition, the infrared rays reflected on the outer surface of the shield plate can irradiate the outer surface of the weight, heating the weight still more efficiently.

(12) Since a refrigerant runs through a refrigerant passage to cool the shield plate, the temperature rise inside the shield plate can reliably be prevented.

(13) Since an inert gas is used as the refrigerant and the inert gas is blown out from the refrigerant passage to perform a purge by the inert gas, the solder bumps and the weight can reliably be protected from oxidation.

(14) Since the first step of the infrared output control in which a rise temperature higher than the melting temperature of the solder bumps is set as a target temperature and the second step of the infrared output control in which, when the temperature reaches the melting temperature, the target temperature is switched to the melting temperature are performed, the solder bumps of the heating object can be heated quickly and precisely to the melting temperature.

(15) Since, before the foregoing two step control, a three step control adding the infrared output control in which a preheating temperature lower than the melting temperature is set as a target temperature is performed to heat the solder bumps to the preheating temperature and to dry the flux, a sharp temperature rise reaches herein a liquid flux a boiling point to produce bubbles and can be guided upset the solder bumps, thus contributing to enhancing the bonding quality.

(16) Since the drive mechanism for elevating the infrared heater is used so as to adjust the space between the infrared heater and the upper surface of the weight, the heating temperature or temperature distribution of the solder bumps can be controlled. For example, extending the space between the infrared heater and the weight allows heating only the center part of the chip part or to lower the heating temperature, in addition, only adjusting the height of the infrared heater in accordance with the size of the chip part can uniformly heat even the small heating object to a certain temperature.

(17) Since the temperature of the solder bumps is measured by the radiation thermometer and the infrared output power of the infrared heater is controlled through a feedback control loop in accordance with the measurement result, the solder bumps can reliably be heated to the melting temperature.

DESCRIPTION OF THE PREFERRED EMBODIMENTS

Preferred embodiments of the invention will hereafter be described with reference to the accompanying drawings.

Figure 1:
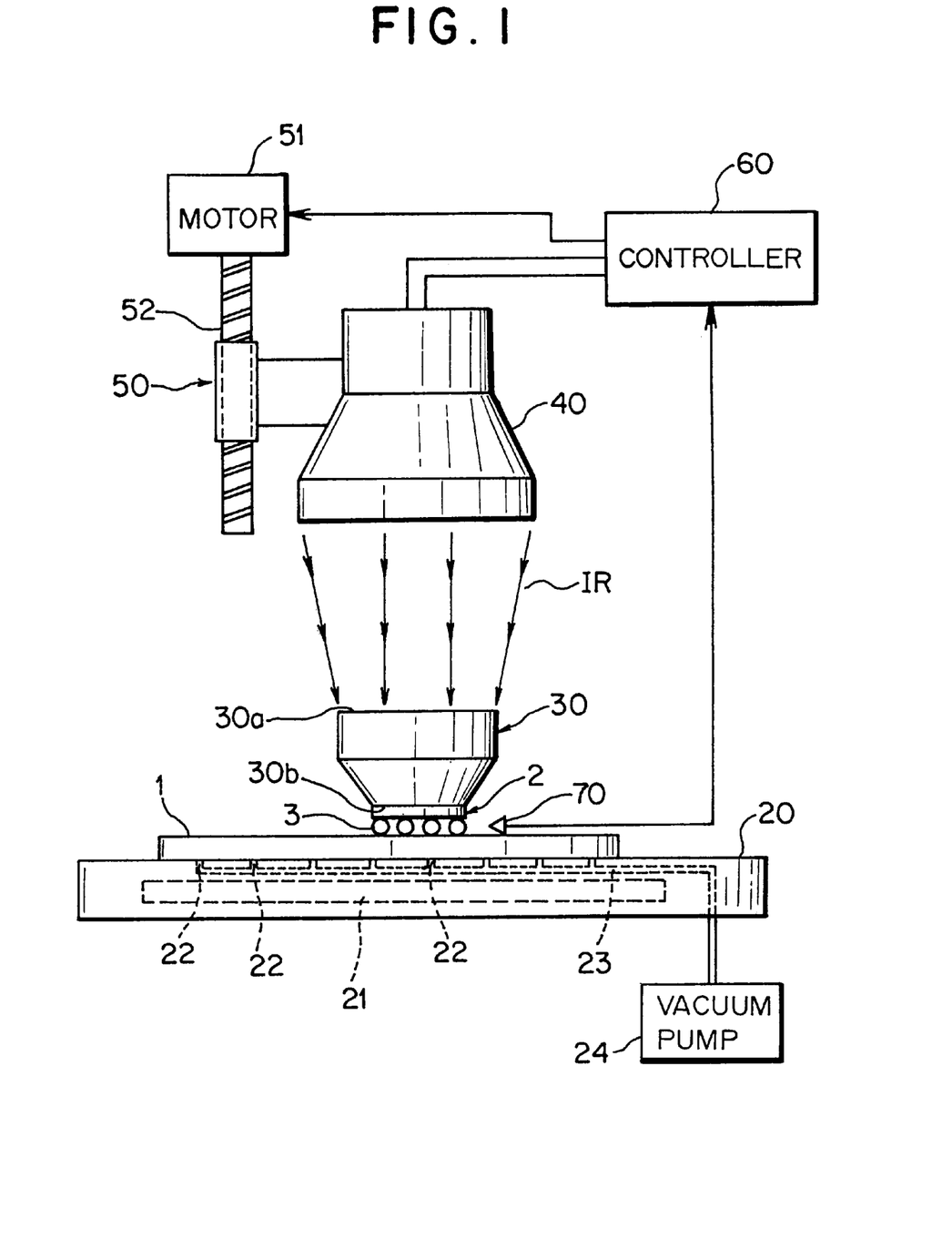
FIG. 1 is a side view showing a construction of an apparatus for bonding chip parts as one embodiment of the present invention.

FIG. 1 is a side view typically showing a construction of a chip bonding apparatus as one embodiment of the present invention.

As shown in FIG. 1, the apparatus of this embodiment bonds a bare chip (flip chip, chip part) 2 of an LSI, etc. having multiple solder bumps 3 on the underside thereof to a board (base material) 1 of an MCM, etc. by the solder bumps 3. The apparatus comprises an X-Y table 20, weight 30, infrared heater 40, elevation drive mechanism 50, controller 60, and radiation thermometer 70. The apparatus further comprises a shield plate 80 as needed.

The X-Y table 20 determines a position on the horizontal plane (a position in the X-Y plane) of the board 1 for a work to be replaced. This X-Y table 20 is incorporated with a preheater 21 for preheating the board 1. And, in order to absorb and clamp the board 1 at a specific position, a plurality of suction openings 22 is formed on the upper surface of the X-Y table 20. The suction openings 22 communicate with a vacuum pump 24 through a suction passage 23.

The weight 30 is mounted on the upper surface of the bare chip 2 disposed at a specific position on the board 1, while having a specific weight set based on the number of the solder bumps 3 and a surface tension at melting of the solder bumps 3; it functions to adjusting a sinkage of the bare chip 2. When the bare chip 2 is made of a silicon wafer and the surface has luster, the bare chip 2 reflects the infrared rays and does not absorb them. In order to heat such a bare chip 2, the weight 30 is formed of a highly heat absorbing material such as a carbon.

And, in this embodiment, the infrared heater 40 (infrared lamp, electromagnetic wave irradiating apparatus) is provided, whereby the weight 30 is heated in noncontact, the heat is transferred to the solder bumps 3 on the underside of the bare chip 2 through the weight 30, and the solder bumps 3 are melted to bond the bare chip 2 to the base material 1. This infrared heater 40 converges near-infrared rays IR (electromagnetic wave) on an upper surface 30a of the weight 30 to heat the weight 30. Further, as the infrared heater 40, instead of the convergent irradiation type, an open irradiation type may be used.

The elevation drive mechanism 50 is to drive the infrared heater 40 vertically (Z direction) to set a positioning, and it is made up with, for example, a ball screw 52 and a motor 51 for driving the ball screw 52 combined.

The weight 30, can be made of a carbon only, one made of e.g., a carbon with a heat resistant glass coated on the outer surface thereof, a carbon and a copper, a copper only, or an aluminum only. The material of the weight 30 is appropriately selected in correspondence with the characteristics of the board 1, bare chip 2, and solder bumps 3.

In an example, if the bare chip 2 is made of a non-absorbing material of the infrared rays as described above, using a heat absorbing carbon as the material for the weight 30 can efficiently heat the bare chip 2 to melt the solder bumps 3 through the weight 30. In this case, applying a heat resistant glass coating on the outer surface of the weight 30 made of a carbon can reliably prevent the carbon from deforming due to oxidation (change into a soot) of the carbon by the heat.

And, since the specific gravity of the carbon is low, to making the weight 30 heavy by only using a carbon necessarily increases the volume of the weight 30. Accordingly, using a carbon and copper and embedding the copper at the lower part of the weight 30 made of a carbon can sufficiently make the weight 30 heavy, without increasing the volume of the weight 30 and without losing the heat absorbing property of the carbon. The weight 30 formed from a combination of carbon and copper is used effectively in case the sinkage of the bare chip 2 must be increase at melting of the solder bumps 3.

Further, gradual heating and gradual cooling are needed depending on the property of the solder bumps 3 and board 1. In such a case, using the weight 30 made of a copper can prevent a rapid increase of the temperature and a rapid cooling. In addition, making the weight 30 of an aluminum only will lighten the weight 30. When the temperature goes up to some degree, the heat becomes difficult to be transferred; and therefore, such a weight 30 made of an aluminum can effectively be used when a stabilized heating with a low load and low temperature is required.

Figure 3:
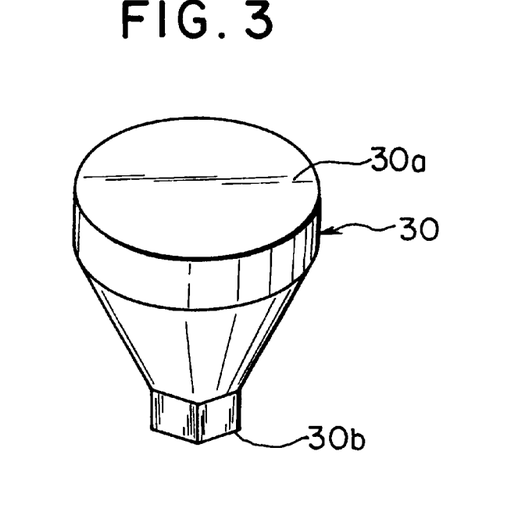
FIG. 3 is a perspective view of a weight in the embodiment.
Figure 4:
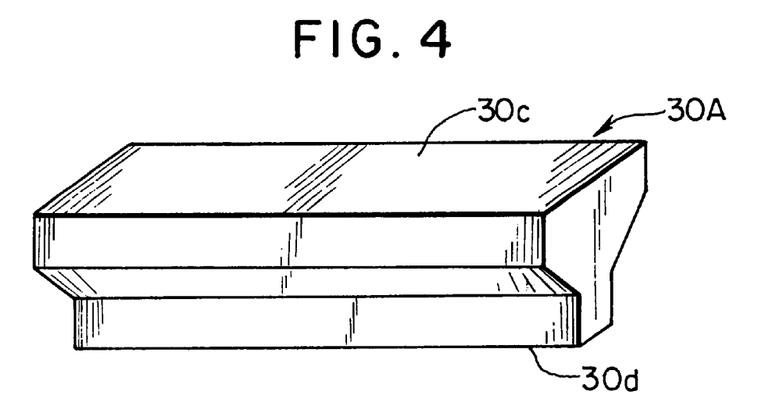
FIG. 4 is a perspective view showing a modified example of the top shape of the weight in the embodiment.
Figure 5:
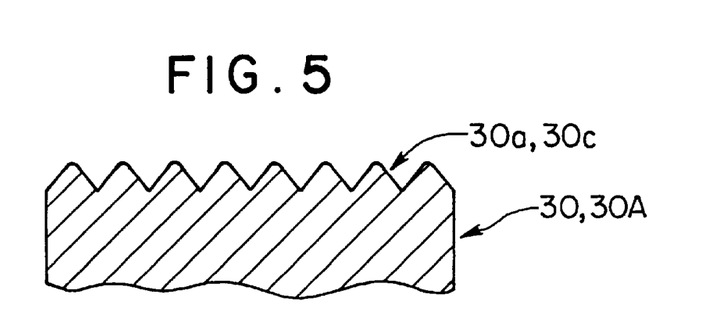
FIG. 5 is a sectional view showing a modified example of the top shape of the weight in the embodiment.

On the other hand, as shown in FIGS. 3 through 5, various shapes of the weight 30 are used in correspondence with the shape of the infrared irradiation from the infrared heater 40, the shape of the bare chip 2, and the like.

The plane shape of the upper surface 30a of the weight 30 in this embodiment is designed to be identical or virtually identical to the shape of the infrared irradiation from the infrared heater 40. In this embodiment, the infrared heater 40 applies a spot heater that converges the infrared rays in a spot. Therefore, in order to absorb the convergent light on the whole upper surface 30a of the weight 30, the shape of the upper surface 30a of the weight 30 is formed to be identical to the shape of the spot (circle). Thereby, the infrared rays can efficiently be received on the upper surface 30a of the weight 30 without irradiating an area other than the weight 30.

And, the plane shape of the lower surface 30b of the weight 30 in this embodiment is made to be identical or virtually identical to the plane shape of the upper surface of the bare chip 2 (square or rectangle). The weight 30 is formed in a downward convex shape, namely, in a upward divergent shape from the lower surface 30b toward the upper surface 30a. Thereby, the weight 30 can be mounted on the upper surface of the bare chip 2 without influencing the other parts except the bare chip 2 to be heated, and in addition, a sinkage load to be applied to the bare chip 2 can be adjusted by the area of the upper surface 30a of the weight 30.

When bonding a rectangular part, a line heater that converges the infrared rays in a line is used for the infrared heater 40, and a weight 30A as shown in FIG. 4 is employed. The plane shape of the upper surface 30c of this weight 30A is a line shape (rectangle), the plane shape of the lower surface 30d is identical to the top shape of the rectangular part, and the weight 30A is formed in a downward convex shape, namely, in a upward divergent shape from the lower surface 30d toward the upper surface 30c.

Further, irregularities shown in FIG. 5 may be formed on the upper surface 30a, 30c of the weight 30, 30A. Forming these irregularities increases the surface area on the upper surface 30a, 30c of the weight 30, 30A to efficiently heat the weight 30, 30A. And in addition, forming the irregularities so as to correspond to an incident angle of the infrared rays irradiated from the infrared heater 40 makes it possible to receive the infrared rays more efficiently on the weight 30, 30A to heat the weight 30, 30A.

In this embodiment, the controller 60 is provided which controls the output power of the infrared rays from the infrared heater 40 as well as controls the operation of the motor 51 to adjust the height of the infrared heater 40 (space between the infrared heater 40 and the upper surface 30a of the weight 30).

When the infrared heater 40 irradiates the weight 30, the controller 60 controls as follows.

Figure 6:
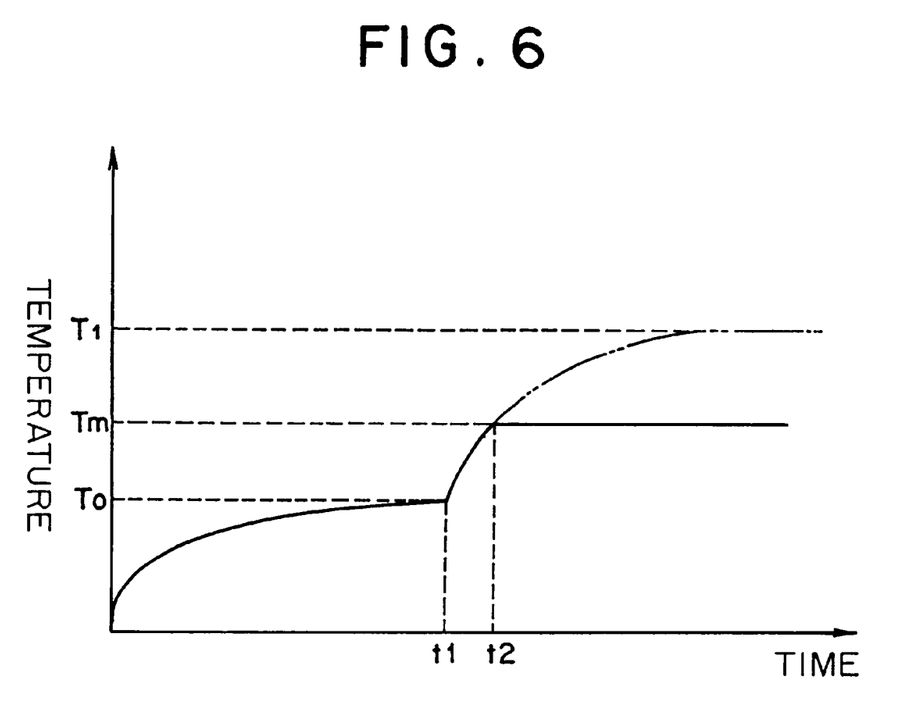
FIG. 6 is a graph showing a relation between the time and the target temperature for explaining the three step control of the infrared output in the embodiment.

(1) As shown in FIG. 6, a preheating temperature $T_0$ lower than the melting temperature of the solder bumps 3 is set as a target temperature and the output power of the infrared rays from the infrared heater 40 is controlled in accordance with the target (first step control); when the temperature reaches the preheating temperature To, at time $t_1$, a rise temperature $T_1$ higher than the melting temperature of the solder bumps 3 is set as a target temperature and the output power of the infrared rays from the infrared heater 40 is controlled in accordance with the target (second step control); and when the temperature reaches the melting temperature $T_m$, at time $t_2$, the target temperature is switched to the melting temperature $T_m$ and the output power of the infrared rays from the infrared heater 40 is controlled in accordance with the target (third step control).

The foregoing first step control secures a time to cure the flux, and heats the solder bumps 3 to the preheating temperature so that the flux can be dried. Therefore, it can be reliably avoided that a liquid flux by a sharp temperature rise reaches to a boiling point to produce bubbles and upset the solder bumps 3, thus enhancing the bonding quality.

And, the foregoing second step and third step controls heat the solder bumps 3 to the melting temperature $T_m$ quickly and precisely. When the second step and third step controls are done by using an ordinary heater, the actual temperature often becomes lower than the melting temperature $T_m$. However, according to this embodiment, by using the weight 30 made of a carbon and heating by the infrared heater 40, only switching the target temperature to a desired temperature (melting temperature $T_m$) when the temperature rises up to the desired temperature will heat the work to the desired temperature in a very stabilized condition.

(2) The operation of the motor 51 of the elevation drive mechanism 50 is controlled so as to adjust the height of the infrared heater 40, namely, the space between the infrared heater 40 and the upper surface 30a of the weight 30, thereby controlling the heating temperature or temperature distribution of the solder bumps 3. The infrared heater 40 of this embodiment, for example, converges the infrared rays in a spot, and therefore, extending the space between the infrared heater 40 and the weight 30 will heat only the center part of the bare chip 2 or to lower the heating temperature. In addition, only adjusting the height of the infrared heater 40 in accordance with the size of the bare chip 2 will uniformly heat even the small heating object to a certain temperature.

(3) Further, the apparatus of this embodiment is provided with the radiation thermometer 70 to measure the temperature of the solder bumps 3. In accordance with the measurement result by this radiation thermometer 70, the infrared output is controlled with a feedback mechanism. Thereby, the solder bumps 3 can reliably be heated to the melting temperature $T_m$.

Figure 2:
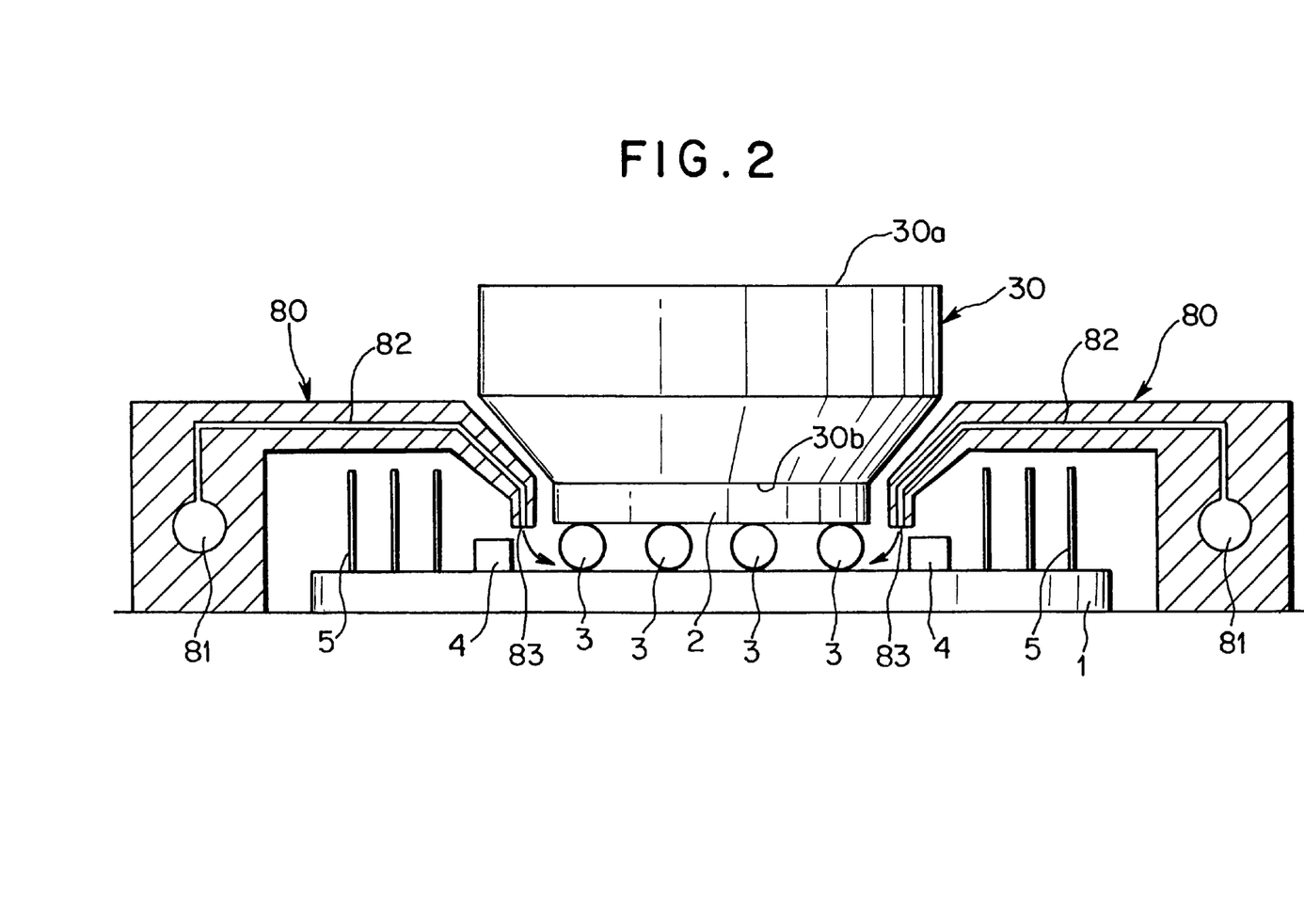
FIG. 2 is a sectional view showing an installation of a shield plate and a construction of a cooling system formed in the shield plate in the embodiment.

On the other hand, as shown in FIG. 2, when the other part 4 such as a capacitor or resistor and an I/O pin 5, in addition to the bare chip 2 constitute the work to be heated, are mounted on the board 1, is the shield plate 80 shields in advance the other part 4 and the I/O pin 5 except for the bare chip 2 from the infrared rays in order to protect this part 4 and I/O pin 5 from heat.

In this embodiment, a mirror finish is applied in advance on the outer surface of the shield plate 80. Thereby, the infrared rays diverted from the upper surface 30a of the weight 30 and irradiating the shield plate 80 reflects on the outer surface of the shield plate 80. Accordingly, the temperature rise inside the shield plate 80 can be prevented, and in addition, the infrared rays reflected on the outer surface of the shield plate 80 irradiates the outer surface of the weight 30, which heats the weight 30 still more efficiently.

Furthermore, in this embodiment, the refrigerant passage 81 through which a refrigerant runs to cool the shield plate 80 is incorporated in the shield plate 80. Thereby, the temperature rise inside the shield plate 80 can reliably be avoided, and a thermal influence on the other parts, except for the work to be heated, can reliably be avoided. As the refrigerant, a water or an inert gas is used, and this embodiment employs a nitrogen gas as the inert gas. Further, the refrigerant passage 81 may be formed of a pipe or the like to be attached on the periphery of the shield plate 80 instead of being incorporated in the shield plate 80.

The shield plate 80 of this embodiment is further provided with a plurality of blowout holes 83 formed at positions adjoining to bonding areas between the bare chip 2 and the board 1, and blowout passages 82 for introducing the nitrogen gas from the refrigerant passage 81 to the blowout holes 83. Thereby, the nitrogen gas is blown from the refrigerant passage 81 through the blowout passages 82 and blowout holes 83 to the bonding areas between the bare chip 2 and the board 1 and to the adjoining areas thereof. Thus, the nitrogen gas purge (nitrogen blow) is done, whereby the solder bumps 3 and the weight 30 can reliably be protected from oxidation. Further, instead of the nitrogen gas, a helium gas may be used for forcedly cooling the bonding areas between the bare chip 2 and the board 1 and the adjoining areas thereof.

The apparatus thus constructed bonds the bare chip 2 to the board 1 as follows.

When, after manufacturing an MCM and inspecting it, a defective bare chip is found, only the defective bare chip is removed. As shown in FIGS. 1 and 2, a new bare chip 2 is replaced at a specific position on the board 1, and the solder bumps 3 on the underside of the bare chip 2 are melted to bond the bare chip 2 to the board 1.

In this embodiment, the board 1 is mounted on the X-Y table 20, suctioned by a vacuum pump 24 through a suction passage 23 and suction openings 22, and clamped to the X-Y table 20.

Then, the new bare chip 2 is replaced at a specific position on the board 1, the weight 30 made of a heat sink material (carbon) having a specific weight set on the basis of the number of the solder bumps 3 and a surface tension at melting of the solder bumps 3 is mounted on the upper surface of the bare chip 2, near-infrared rays IR are irradiated on the upper surface 30a of the weight 30 from the infrared heater 40 to heat the weight 30, and the radiant heat melts the solder bumps 3 on the underside of the bare chip 2 to bond the bare chip 2 on the board 1. Further, when bonding the bare chip 2, preheating the board 1 by a preheater 21 incorporated in the X-Y table 20 will prevent heat transferred from the weight 30 to the solder bumps 3 from spreading out into the board 1.

Here, a sinkage of the bare chip 2 receiving a load by the weight 30 is determined in accordance with a balance of the surface tension of the melted solder bumps 3 and the weight of the weight 30, so that the bare chip 2 is retained at a certain height. Further, since all the solder bumps 3 are uniformly melted, the bare chip 2, receiving the load by the weight 30 as the solder bumps 3 melt, is placed flat with a certain sinkage, which ensures a stabilized reflow.

Thus, according to the embodiment of the present invention, in a state that the weight 30 with an appropriate weight is mounted on the bare chip 2, the near-infrared rays IR are irradiated on the upper surface 30a of the weight 30 to heat and melt the solder bumps 3 on the underside of the bare chip 2 in noncontact. Accordingly, the positioning of the reflow tool becomes unnecessary in this embodiment, which is a common exercise in the conventional tool (refer to the reflow tool 11 in FIG. 7). Further, the weight 30 is free of the thermal expansion of the board 1 and the like, exerts an appropriate pressure to the bare chip 2 by its own weight, and sinks the bare chip 2 into the melted solder bumps 3 to an appropriate depth.

Accordingly, bonding by fine solder bumps 3 can be done uniformly and reliably, the bonding quality is stabilized, and the production quality of an MCM and the like is significantly enhanced. Further, equipment requiring a precise control is not needed, and inexpensive equipment (apparatus) for bonding chip parts can be provided, which greatly contributes to enhancing productivity.

In the foregoing embodiment, the infrared heater 40 is used as an electromagnetic wave irradiating apparatus, whereby the near-infrared rays IR irradiate the upper surface 30a of the weight 30. However, the present invention is not limited to this, the other electromagnetic wave such as a microwave may be used to irradiate the upper surface 30a of the weight 30 and heat the weight 30, and in the end the solder bumps 3. This case also provides the same function and effect as the foregoing.

In the foregoing embodiment, the bare chip 2 on the board 1 of an MCM and the like is replaced with a new one to be bonded again. In addition to this, the embodiment of the invention can be applied to a case in which bump bonding type components (such as a capacitor) are replaced and bonded again on a board of an MCM and the like, and achieves the same function and effect as the foregoing.

What is claimed is:

1. A method of bonding a chip part to a substrate using solder bumps, comprising the steps of:

forming a chip part having an upper surface and a lower surface;

placing said lower surface over said substrate with a predetermined number of solder bumps sandwiched between said lower surface and said substrate;

putting a weight of a heat absorbent material on the upper surface of said chip part, said weight being based on both the predetermined number of said solder bumps and a degree of surface tension of each of the solder bumps in a molten state;

irradiating electromagnetic waves to said weight to heat said weight, which heats said chip and heats said solder bumps to a molten state; and during said irradiating step, maintaining a fixed amount of pressure on said chip part by said weight.

2. The method as claimed in claim 1, wherein the electromagnetic waves in said irradiating step are infrared rays emitted from an infrared heater.

3. The method as claimed in claim 2, wherein said weight is made of carbon.

4. The method as claimed in claim 3, wherein an exterior surface of said weight is coated with a heat resistant glass.

5. A method as claimed in claim 2, wherein said weight is made of both carbon and copper.

6. The method as claimed in claim 2, wherein said weight is made of copper.

7. The method as claimed in claim 2, wherein said weight is made of aluminum.

8. The method of as claimed in claim 2, wherein said weight has an upper surface with a shape which is substantially identical to a shape of the infrared rays emitted from the infrared heater.

9. The method as claimed in claim 2, wherein said weight has an upper surface, and a lower surface with a shape which is substantially identical to a shape of the upper surface of said chip part, and said weight has an upwardly flared contour whose horizontal section gradually increases from the lower surface to the upper surface of the weight.

10. The method as claimed in claim 2, wherein said weight has an upper surface which is uneven.

11. The method as claimed in claim 2, further comprising a step of covering an area of said substrate outside of said chip part with a shield plate to shield the infrared rays from the area of the substrate during said irradiating.

12. The method as claimed in claim 11, wherein an outer surface of said shield plate is mirror-finished.

13. The method as claimed in claim 11, wherein said shield plate has a refrigerant passage, said method further comprising a step of, during said irradiating step, allowing a refrigerant to flow through said refrigerant passage to cool said shield plate.

14. The method as claimed in claim 13, wherein said refrigerant is inert gas, said method further comprising a step of blowing said inert gas from said refrigerant passage to said solder bumps.

15. The method as claimed in claim 2, wherein said irradiating step includes:

setting a rise temperature higher than a melting point of the individual solder bumps as a target temperature to control an output power from said infrared heater so as to heat said solder bumps towards said rise temperature; and when said solder bumps have reached the melting point, switching the target temperature to the melting point to control the output power from said infrared heater so as to maintain said solder bumps at the melting point.

16. The method as claimed in claim 15, wherein said irradiating step further includes, before said setting step, setting a preheating temperature lower than the melting point of the individual solder bumps as the target temperature to control the output power from said infrared heater so as to heat said solder bumps to said preheating temperature.

17. The method as claimed in claim 2, further comprising a step of adjusting a distance between said infrared heater and said weight to control the heating temperature and distribution of temperature in said solder bumps.

18. The method as claimed in claim 2, wherein a radiation thermometer makes a feedback control loop with said infrared heater, said method further comprising the steps of:

measuring a temperature of said solder bumps by said radiation thermometer; and controlling an output power of said infrared heater in accordance with a result of said measurement through said feedback control loop.

* * * * *